United States Patent
Dyba

(10) Patent No.: US 10,488,251 B2
(45) Date of Patent: Nov. 26, 2019

(54) METHOD FOR IMPROVING THE DYNAMIC RANGE OF A DEVICE FOR DETECTING LIGHT

(71) Applicant: Leica Microsystems CMS GmbH, Wetzlar (DE)

(72) Inventor: Marcus Dyba, Heidelberg (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 125 days.

(21) Appl. No.: 15/551,915

(22) PCT Filed: Feb. 24, 2016

(86) PCT No.: PCT/EP2016/053832
§ 371 (c)(1),
(2) Date: Aug. 18, 2017

(87) PCT Pub. No.: WO2016/135178
PCT Pub. Date: Sep. 1, 2016

(65) Prior Publication Data
US 2018/0031420 A1 Feb. 1, 2018

(30) Foreign Application Priority Data
Feb. 24, 2015 (LU) .......................... 92665

(51) Int. Cl.
*G01J 1/44* (2006.01)
*G01J 1/42* (2006.01)
*G02B 21/00* (2006.01)
*G01J 3/02* (2006.01)
(Continued)

(52) U.S. Cl.
CPC . *G01J 1/44* (2013.01); *G01J 1/42* (2013.01); *G01J 3/0297* (2013.01); *G01J 3/2803* (2013.01); *G02B 21/008* (2013.01); *H01L 31/107* (2013.01); *G01J 2001/442* (2013.01);
(Continued)

(58) Field of Classification Search
CPC .......... G01J 1/44; G01J 3/0297; G01J 3/2803; G01J 1/42; G01J 2001/4406; G01J 2001/4466; G01J 2001/444; G01J 2001/442; H01L 31/107; G02B 21/008
See application file for complete search history.

(56) References Cited

U.S. PATENT DOCUMENTS

2011/0095192 A1 4/2011 Johnson
2013/0015331 A1* 1/2013 Birk .................. G01J 3/36
250/208.2

FOREIGN PATENT DOCUMENTS

EP 1928167 A1 6/2008
EP 2546621 A1 1/2013
(Continued)

*Primary Examiner* — Tony Ko
(74) *Attorney, Agent, or Firm* — Leydig, Voit & Mayer, Ltd.

(57) ABSTRACT

A method for improving dynamic range of a device for detecting light includes providing at least two detection regions. The detection regions are each formed by an array of a plurality of single-photon avalanche diodes (SPADs) and the detection regions each comprise at least one signal output. A characteristic curve is determined for each of the detection regions. The characteristic curves are combined with one another and/or offset against one another in order to obtain a correction curve and/or a correction factor.

20 Claims, 9 Drawing Sheets

(51) Int. Cl.
*G01J 3/28* (2006.01)
*H01L 31/107* (2006.01)

(52) U.S. Cl.
CPC . *G01J 2001/444* (2013.01); *G01J 2001/4406* (2013.01); *G01J 2001/4466* (2013.01)

(56) References Cited

FOREIGN PATENT DOCUMENTS

| | | |
|---|---|---|
| WO | WO 2013093035 A1 | 6/2013 |
| WO | WO 2014066813 A1 | 5/2014 |

\* cited by examiner

METHOD FOR IMPROVING THE DYNAMIC RANGE OF A DEVICE FOR DETECTING LIGHT

CROSS-REFERENCE TO PRIOR APPLICATIONS

This application is a U.S. National Stage Application under 35 U.S.C. § 371 of International Application No. PCT/EP2016/053832 filed on Feb. 24, 2016, and claims benefit to Luxembourg Patent Application No. LU 92665 filed on Feb. 24, 2015. The International Application was published in German on Sep. 1, 2016 as WO 2016/135178 A1 under PCT Article 21(2).

FIELD

The invention relates to a method for improving the dynamic range of a device for detecting light. Furthermore, the invention relates to a corresponding device. In addition, the invention relates to a microscope comprising a corresponding device.

BACKGROUND

Devices and methods for detecting light have been known in practice for many years, and are used in laser-scanning microscopes, for example. In this case, corresponding devices that detect the detection signal from the sample to be microscopically examined are of key importance to the image quality. This primarily applies to comparatively weak detection signals, as are typical in (confocal) fluorescence microscopy, SHG microscopy or Raman microscopy.

Two parameters are of particular importance for light detectors, namely the detector noise and the quantum yield, i.e. the detection efficiency. Here, the quantum yield describes the proportion of light incident on the detector that actually generates a usable electrical signal. The noise describes the electronic base signal that is superimposed on the actual detection signal in an interfering manner. The ratio between these two values, known as the signal to noise ratio (SNR), is one of the key parameters of a light detector.

In practice, photomultipliers (PMTs) have been the dominant light detectors in laser-scanning microscopy for many years. In comparison with semiconductor-based detectors, e.g. photodiodes, PMTs have a lower quantum yield. Due to the low noise thereof, they provide a very good SNR, however. Furthermore, improved variants having a GaAsP (gallium arsenide phosphide) layer as a light-sensitive medium have become available in recent years.

Furthermore, it has been known for a number of years to use semiconductor detectors in fluorescence microscopy as an alternative. Here, "single-photon avalanche diodes" (SPAD) are of particular significance. The SPADs operate in Geiger mode. In this case, a cutoff voltage is applied to the SPADs, which is slightly above the breakdown voltage. The breakdown voltage is several hundred volts in this case.

In this mode, an absorbed photon generates an electron-hole pair in the semiconductor, which pair is accelerated by the strong electrical field and carries out further impact ionizations. This process continues in the manner of an avalanche and triggers a measurable charge avalanche that is amplified by a factor of several million. Therefore, individual absorbed photons can be measured, meaning that these detectors can be used for measuring extremely low amounts of light, as are common in fluorescence microscopy, for example.

In this process, a single photon leads to an electrical discharge, which is measured in the form of a short voltage pulse. Here, there are essentially two measurement modes. In the digital measurement mode, the voltage pulses are counted, the rising voltage edge being used as a triggering counter signal. Alternatively, in what is known as the analog measurement mode, the charge can be integrated by means of a measuring resistor and the accumulated charge of all the pulses is used as a measurement signal. Typically, the integrated charge of all the pulses in a set time period (pixel exposure time) is then digitalized by an analog/digital converter for further digital processing.

Irrespective of the selected measurement mode, one problem with SPADs is that signal saturation occurs. Specifically, the measurement signal no longer rises to the same extent when the amount of light incident on the detector increases. The desired linear relationship between the input signal and the output signal thus no longer exists. The saturation occurs because, during an avalanche discharge of the SPADs, another absorbed photon cannot trigger a simultaneous, second avalanche. Therefore, after pulse triggering, there is some dead time of the SPADs during which detection cannot take place. This dead time corresponds to the time that is required to recharge the charge carrier in the semiconductor that has been depleted during the avalanche discharge. Large amounts of light in which a plurality of photons are incident within the dead time therefore can no longer be completely detected and the detector displays a non-linear saturation characteristic curve.

Since the low dynamic range of the detectors resulting therefrom having a maximum count rate of some $10^6$ to $10^7$ photons per second is a problem in these highly sensitive detectors, what are known as SPAD arrays have been developed in recent years. These are available for example from the manufacturer Hamamatsu Photonics K.K. under the name multi-pixel photon counting detector, or MPPC detector. In the literature, these detectors are, inter alia, also referred to as silicon photomultipliers (SiPM). The function of corresponding detectors is for example described at <<https://www.hamamatsu.com/resources/pdf/ssd/mp-pc_techinfo_e.pdf>>.

The basic principle of an SPAD array involves a plurality of individual SPADs being connected in parallel to form a field. If a photon is incident on an individual SPAD, then, due to its dead time, it is no longer sensitive for a period of typically a few nanoseconds. Other SPADs on which another photon is incident within this period or even simultaneously can however detect said photon and generate a measurable charge pulse. Therefore, a pulse sequence having a higher count rate than in an individual SPAD can be produced at the detector output.

Therefore, it is known from the prior art to distribute the entirety of the detection light across a plurality of SPADs connected in parallel. This is advantageous in that only a fraction of the detection light impinges on individual SPADs and these SPADs are therefore saturated later. Furthermore, additional SPADs that are ready to receive are available during the dead time of an individual SPAD. The dynamic range of these detectors is therefore significantly increased, depending on the number of SPADs that are connected in parallel. Commercially available SPAD arrays have 20×20 or more SPADs, for example.

However, the known SPAD arrays are also problematic in that they exhibit saturation behavior. Saturation may occur if too many photons are incident on the same SPAD within the dead time. In this case, the saturation is similar to the saturation of a single SPAD. Furthermore, saturation may also occur in the digital detection mode if the rising trigger edges of a pulse do not lead to the digital counter being triggered again during a previous pulse, since the voltage level thereof is above the voltage threshold for triggering the counter (known as the trigger level), and therefore is not detected as a pulse edge by the counting unit.

The two above-mentioned effects also lead to saturation of SPAD arrays. It is known in practice that, for example from approx. $10^8$ incident photons per second, the output signal (the number of electrical discharges) assumes an approximately constant value, such that it is no longer possible to precisely measure the amount of light. Provided that the characteristic curve, which is specific to a given detector design, is known, it can be linearized by computational correction. In the range of almost complete saturation (for example slightly above $10^{11}$ photons per second), computational correction is no longer possible in a sufficiently precise manner, however. Since a characteristic curve in the analog measurement mode displays an almost identical curve as in the digital measurement mode, a distinction is not made in the following between the different causes of saturation.

Although connecting many SPADs in parallel to form an SPAD array therefore constitutes an improvement on the problem of saturation, this problem still persists. Therefore, the dynamic range of known SPAD arrays is still further below the dynamic range of photomultipliers, which are therefore still used for detecting low amounts of light despite the detection efficiency thereof being worse than that of SPAD detectors.

SUMMARY

In an embodiment, the present invention provides a method for improving dynamic range of a device for detecting light includes. At least two detection regions are provided. The detection regions are each formed by an array of a plurality of single-photon avalanche diodes (SPADs) and the detection regions each comprise at least one signal output. A characteristic curve is determined for each of the detection regions. The characteristic curves are combined with one another and/or offset against one another in order to obtain a correction curve and/or a correction factor.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
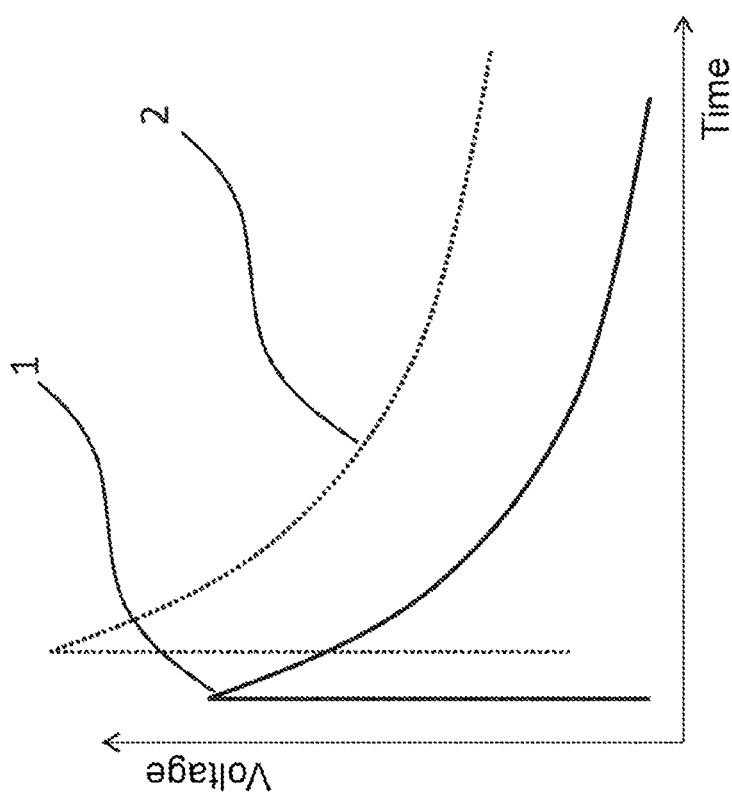
FIG. 1 shows the voltage signal measured by an SPAD as a function of time.

Within the meaning of the invention, light is any electromagnetic radiation that can be detected by a silicon photomultiplier (SiPM) or single-photon avalanche diodes (SPAD), in particular visible light, infrared light, UV light, X-rays and gamma radiation. Therefore, in the context of this application, the term "light intensity" is a synonym for the term "radiation intensity". For example, in a non-limiting manner, the invention can be used in a laser-scanning microscope.

In an embodiment, the present invention provides a method and a device for detecting light, by means of which the effective dynamic range and the detection efficiency can be increased and the characteristic curve can be linearized, together with high sensitivity, an optimized signal to noise ratio and low production costs. The method is not intended to alter the basic properties of the device. A correspondingly equipped microscope is intended to be provided.

According to an embodiment of the invention, the method includes the use of a device for detecting light comprising at least two detection regions, the detection regions each being formed by an arrangement (array) of a plurality of single-photon avalanche diodes (SPADs) and the detection regions each comprising at least one signal output. In this method, a characteristic curve is determined for each of the detection regions and the characteristic curves are combined with one another and/or are offset against one another in order to obtain a correction curve and/or a correction factor.

According to an embodiment of the invention, it has been recognized here that the actually disadvantageous inhomogeneous illumination of the array of SPADs can be utilized advantageously in order to operate or correct the device for detecting light over a much greater dynamic range, namely the range of the total incident amount of light, using a linear characteristic curve than would normally be the case for homogeneous illumination.

The SPAD arrays known from the prior art are used in (confocal) laser-scanning microscopy such that the detection light is focused on the detector surface using conventional optical elements behind the confocal aperture diaphragm. The light that is divergently output behind the aperture diaphragm is imaged onto the detector by means of lenses such that Gaussian light distribution (more specifically Airy distribution) is produced on the detector surface. It is important here that almost all the light is incident on the detection surface and only a negligible amount of light falls beside the detection surface. This is necessary to achieve high detection efficiency. In Gaussian distribution of the detection light, as a result a considerably lower light intensity is incident on the outer SPADs compared with the SPADs positioned in the central region of the detection surface. For example, the outer SPADs are illuminated at less than 10% of the central intensity (the light intensity in the geometric center of the SPAD array). The next SPADs, positioned further inwards, are for example illuminated at approximately 31% of the central intensity. According to the invention, it has been recognized here that the inner SPADs exhibit a saturation effect significantly earlier than the outer SPADs. Therefore, a detector illuminated in this way displays a non-linear characteristic curve even for low total amounts of light.

However, for imaging, a linear characteristic curve is very important for quantitatively correctly capturing images of the sample to be microscopically examined. A simple, known approach is to linearize the known non-linear characteristic curve by means of a correction factor. This is also entirely possible in the transition region after the saturation has begun. Once the characteristic curve is excessively flat, however, i.e. no longer reacts sensitively to rising amounts of light, this simple correction soon reaches its limits.

Also according to an embodiment of the invention, it is now recognized that linear correction can be carried out in an exceptionally simple manner by the characteristic curves of the detection regions being combined with one another and/or offset against one another in order to determine a correction curve and/or a correction factor. Here, the detection region on which a lower proportion of light impinges is used as a "linearity sensor", since the characteristic curve thereof still has a linear or less saturated output signal when the detection region on which a higher light intensity impinges has already become saturated.

Advantageously, an overall characteristic curve formed by the output signals from the signal outputs is corrected, in particular linearized, on the basis of the correction curve and/or the correction factor. As a result, the dynamic range is improved by at least one order of magnitude with little effort and while maintaining the basic properties of the device for detecting light.

Here, the correction curve and/or the correction factor can be determined by dividing the characteristic curves of the individual detection regions. Therefore, the linear progression of the detection regions on which a lower light intensity impinges is used in an exceptionally simple manner to improve the dynamic range.

Furthermore, it is conceivable for the output signals to be corrected, after the actual detection of the light, by digital signal processing, for example by a digital signal processor (DSP), a field programmable gate array (FPGA) or a computer.

Advantageously, the characteristic curves of the detection regions are determined once by a calibration measurement. In particular when the method according to an embodiment of the invention is used in a microscope, the characteristic curve is established for a given design of the device for detecting light and of the lens of the microscope. Therefore, the calibration measurement only needs to be carried out once for a given apparatus design.

In order to improve the dynamic range to a particularly high level, the light to be detected can impinge on the detection regions at different intensities and/or with different spectral ranges. Ideally, in this case the detection region on which a lower intensity impinges is already intended to provide a sufficiently good SNR once the detection region on which a high intensity impinges enters the problematic saturation range.

To provide further flexibility, it is advantageous for the correction of the output signals to be activated if necessary.

According to an embodiment of the invention, a device for detecting light comprises at least two detection regions, the detection regions each being formed by an arrangement (array) of a plurality of single-photon avalanche diodes (SPADs) and the detection regions each comprising at least one signal output.

The same comments apply here as well to the method according to an embodiment of the invention, at least two detection regions to be read out separately being provided so that a detection region on which a lower light intensity impinges can be used as a "linearity sensor".

In particular, in Gaussian light distribution, it is particularly advantageous for a first, inner detection region and a second, outer detection region to be arranged with the second detection region surrounding the first detection region. A higher light intensity therefore impinges on the inner detection region such that the outer, second detection region acts as the "linearity sensor".

Furthermore, at least two detection regions may each be designed as a sub-array of a silicon photomultiplier (SiPM). This means that only one SiPM is required, which produces the at least two detection regions.

Furthermore, it is conceivable for the at least two detection regions to each be designed as an array of an SiPM. Therefore, conventional SiPMs can be used to produce the detection regions, and therefore the device is particularly cost-effective to produce. It is particularly advantageous here for a beam splitter to be arranged such that the light to be detected can be split onto the at least two SiPMs.

Furthermore, it is conceivable for a dispersive element, in particular a prism or a grating, to be arranged such that the detection regions can be impinged upon by different spectral components of the light to be detected. Here, each spectral range can be linearizable, for example in a separate manner, such that it is possible to draw better conclusions on the spectral distribution in a microscopic sample, for example for dye mixtures.

Advantageously, the detection regions can be arranged symmetrically or asymmetrically to one another, such that they can be adapted to the other components as flexibly as possible. It is also conceivable here for the detection regions to form a round or almost round detection surface.

In a preferred manner, a processing module for the digital signal processing of output signals from the signal outputs may be provided. The processing module may be designed as a digital signal processor (DSP) or field programmable gate array (FPGA).

In order to implement the device more flexibly, the output signals from the signal outputs of the detection regions can be coupled together or combined, for example electronically or in a downstream computer, to form a single overall signal.

Use of the device according to the invention in a microscope, in particular a scanning microscope, preferably a laser-scanning microscope, is particularly advantageous. This may be a microscope for fluorescence microscopy and/or for Raman microscopy. Alternatively or additionally, it is conceivable for this to be a microscope for second harmonic generation (SHG) microscopy.

FIG. 1 shows the voltage signal measured by an SPAD as a function of time. With reference to FIG. 1, the saturation of the measurement signal from an SPAD known from the prior art can be identified. A single photon leads to an electrical discharge, which is measured in the form of a short voltage pulse 1. During an avalanche discharge of the SPAD, another absorbed photon cannot trigger a simultaneous, second avalanche, as shown by the dotted voltage pulse 2. Therefore, after pulse triggering, there is dead time during which no more light can be detected.

Figure 2:
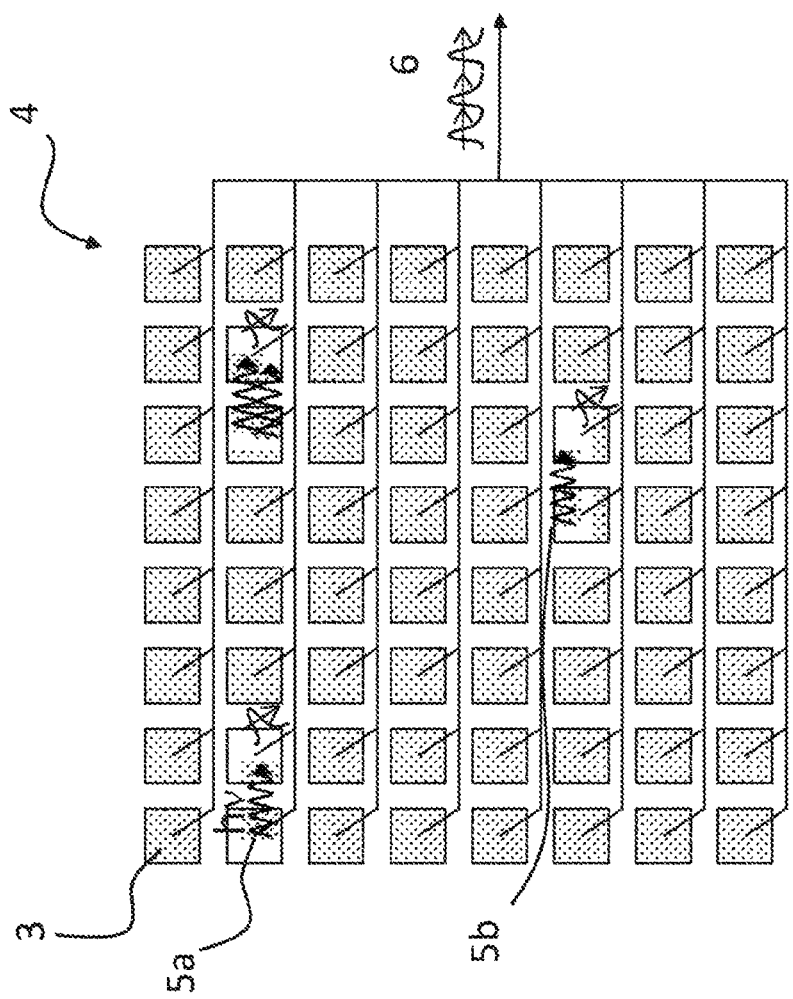
FIG. 2 is a schematic view of the basic construction of an array formed by a plurality of SPADs.

FIG. 2 is a schematic view of the basic construction of a known array 4 formed by a plurality of SPADs 3. For better comprehension, just one SPAD 3 is provided with a reference sign in FIG. 2 and the following figures. Here, a plurality of individual SPADs 3 are connected in parallel to form an array 4. If a photon 5a is incident on an individual SPAD 3, then, due to its dead time, it is no longer sensitive for a few nanoseconds. Other SPADs 3 on which another photon 5b is incident within this period or even simultaneously can however detect the photon 5b and generate a measurable charge pulse. Therefore, a pulse sequence 6 having a higher count rate than in an individual SPAD 3 can be produced at the detector output.

Figure 3:
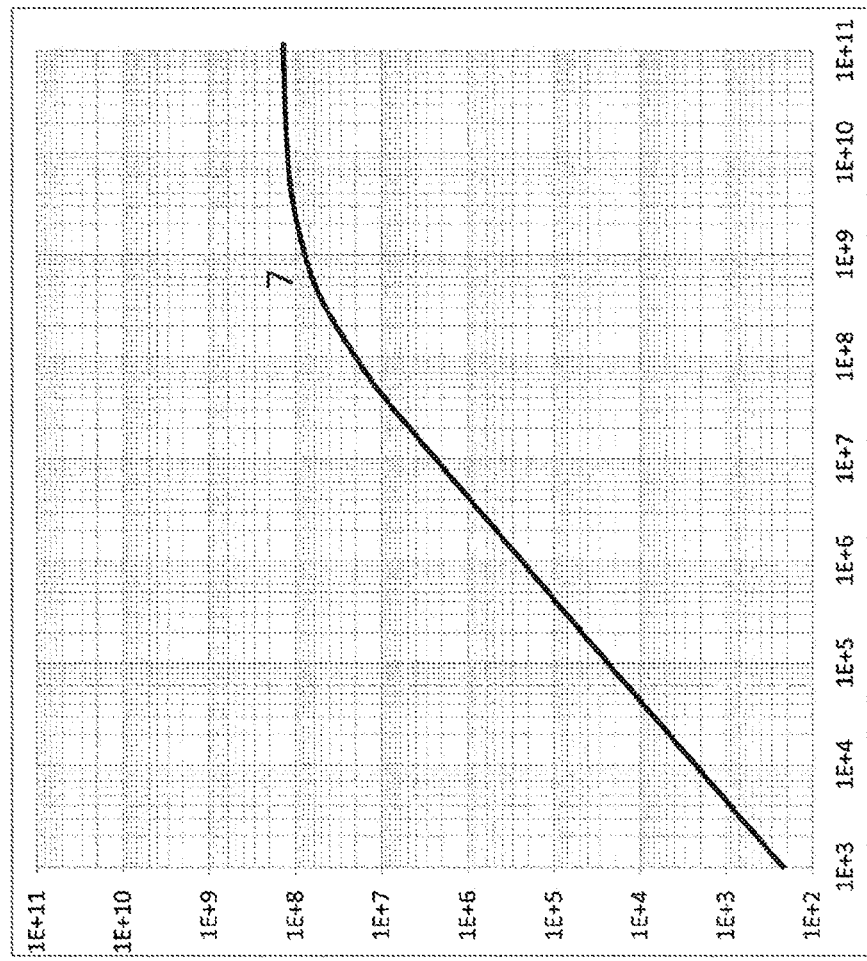
FIG. 3 shows a characteristic curve of an array known from the prior art, when operated in the digital measurement mode.

FIG. 3 shows a characteristic curve 7 of an array 4 known from the prior art, when operated in the digital measurement mode. Specifically, in this figure, the number of electrical discharges in the entire SPAD field (array) is plotted against the number of incident photons over the entire SPAD field per second on a double logarithmic scale. From approx. $10^8$ incident photons per second, the curve becomes non-linear due to the saturation behavior. Above approx. $10^{11}$ photons per second, the output signal (the number of electrical discharges) becomes approximately constant, such that it is no longer possible to precisely measure the amount of light. Provided that the characteristic curve 7, which is specific to a given detector design, is known, it can be linearized by computational correction. In the range of almost complete saturation, i.e. slightly above $10^{11}$ photons per second, this computational correction is no longer possible in a sufficiently precise manner, however. While FIG. 3 shows a characteristic curve 7 for the digital measurement mode, the same also applies to the analog measurement mode.

Figure 4:
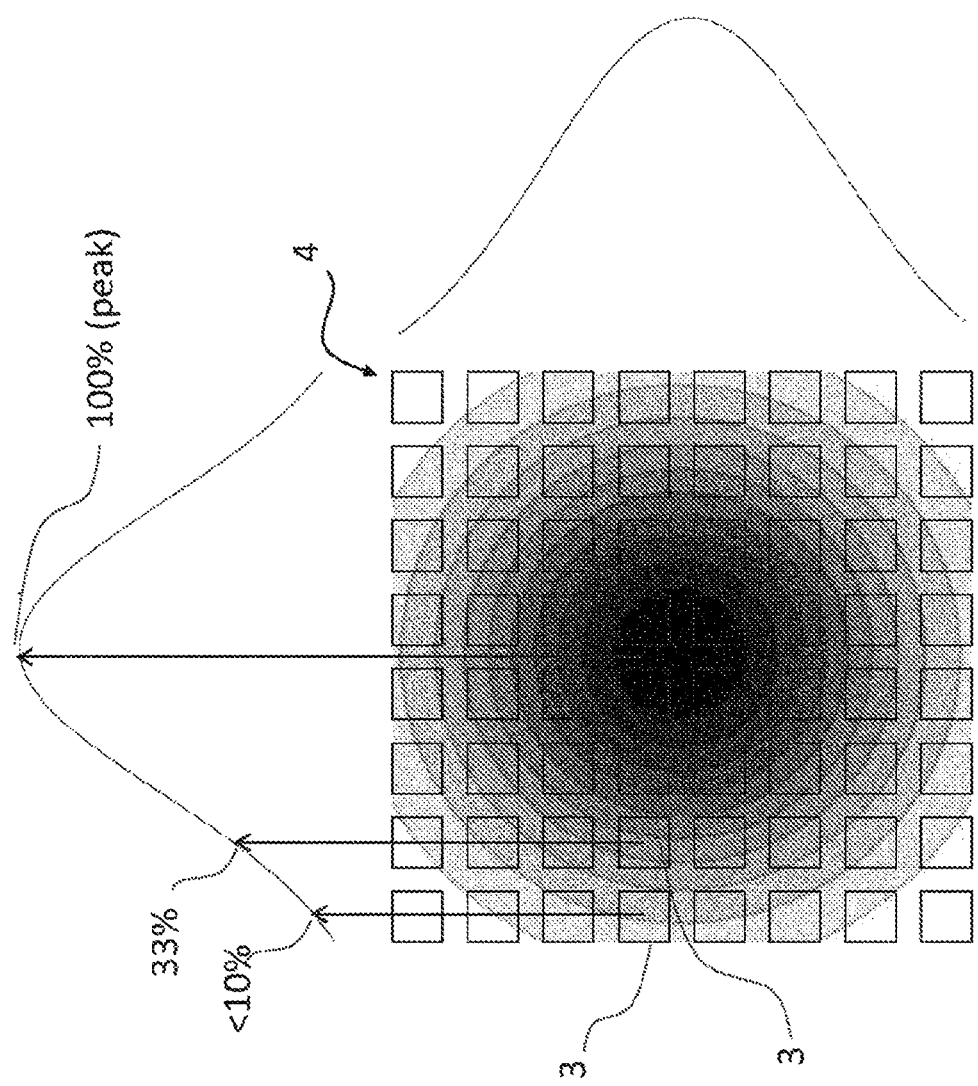
FIG. 4 is a schematic view of the light that is incident on an array arranged in a laser-scanning microscope.

FIG. 4 is a schematic view of the light that is incident on a known array 4 arranged in a (confocal) laser-scanning microscope. It can be clearly seen here that for example the SPADs 3 of the array 4 that are arranged in the edge region are illuminated at less than 10% of the central intensity. The next SPAD 3, positioned further inwards, is likewise only illuminated at approximately 33% of the central intensity. Therefore, the inner SPADs 3 exhibit a saturation effect of the type in the characteristic curve 7 shown in FIG. 3 significantly earlier than outer SPADs 3.

Figure 5:
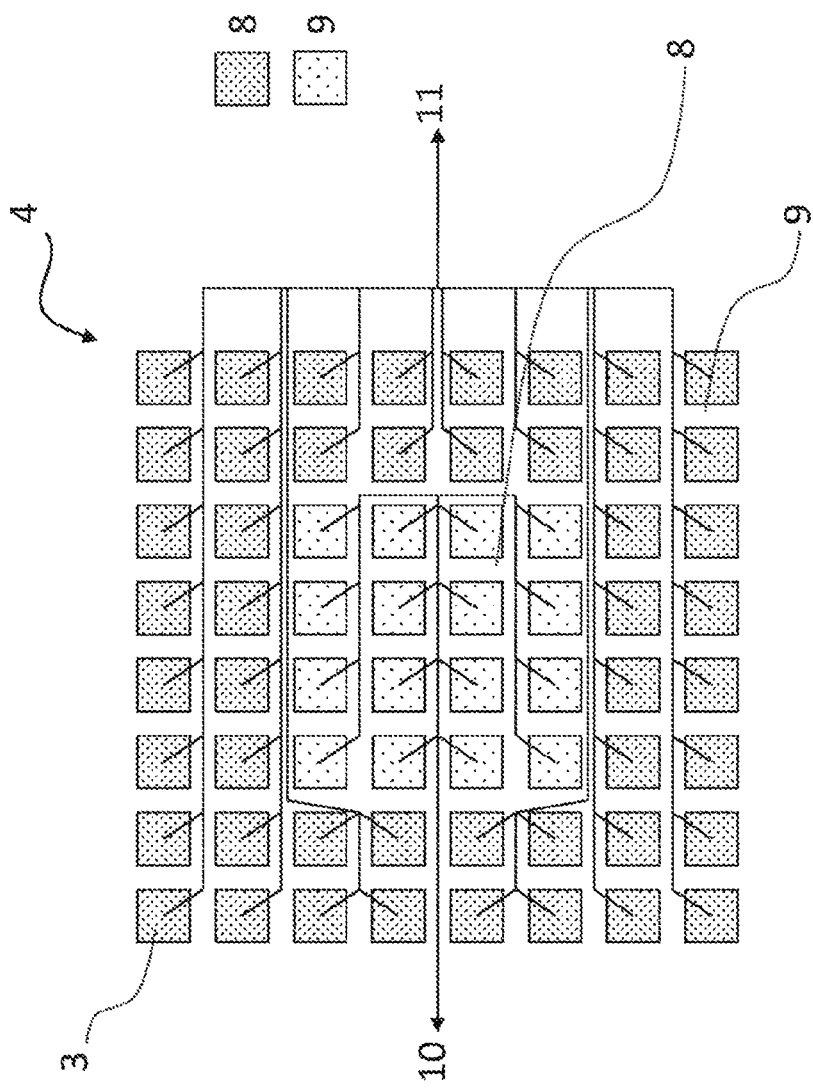
FIG. 5 is a schematic view of an array of a first embodiment of a device according to the invention.

FIG. 5 is a schematic view of a first embodiment of an array 4 of a device according to the invention. This entire array 4 is designed such that a first, inner detection region 8 and a second, outer detection region 9 are provided. The first detection region 8 and the second detection region 9 are each produced as a sub-array of the entire array 4. The first detection region 8 comprises a first signal output 10, and the second detection region 9 comprises a second signal output 11. Therefore, the individual detection regions 8, 9 can be read out independently of one another. If the output signals from the first signal output 10 and the second signal output 11 were electronically combined before any further processing, the device would behave in the same way as a device from the prior art according to FIG. 2.

If a device according to FIG. 5 is used in the conventional beam path of a laser-scanning microscope, a lower light intensity impinges on the second, outer detection region 9 than on the first, inner detection region 8 if a beam profile according to FIG. 4 is taken as a starting point.

Figure 6:
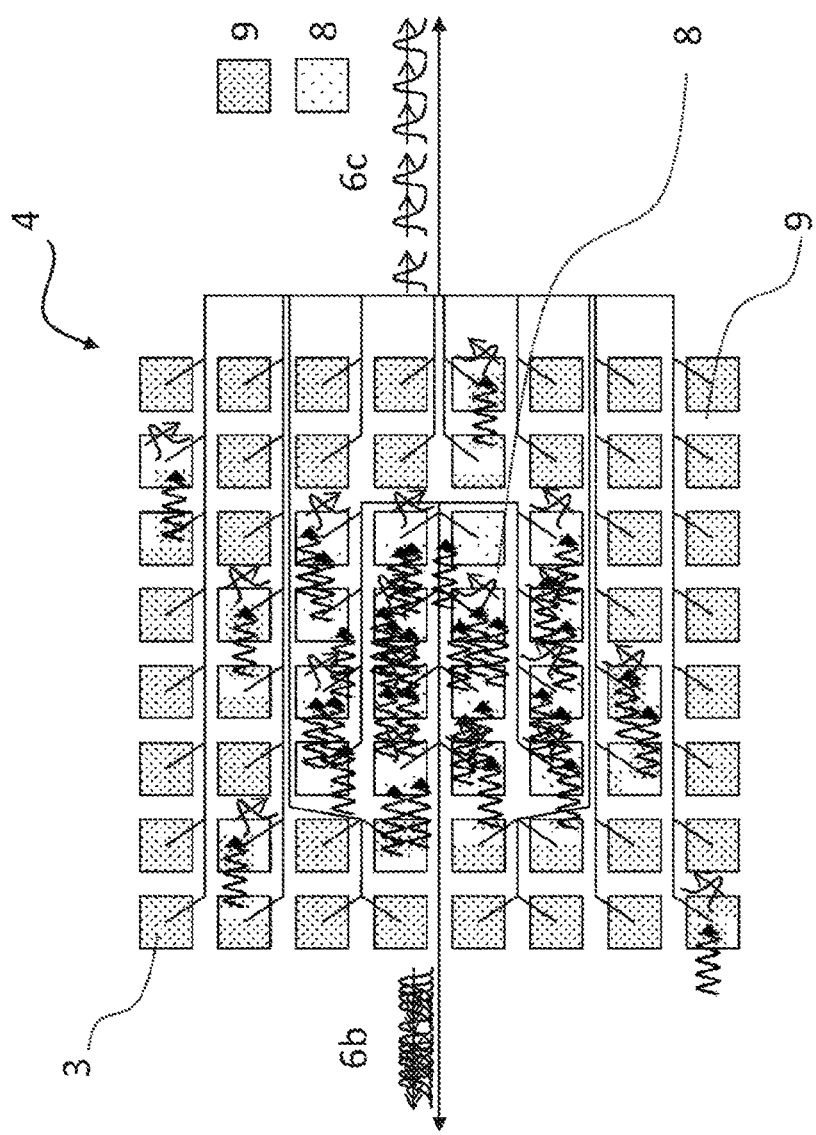
FIG. 6 is a schematic view of the pulse sequences generated by the device according to the invention from FIG. 5.

FIG. 6 is a schematic view of the pulse sequences 6b, 6c generated by the device according to the invention from FIG. 5. In the inner, first detection region 8, the density of incident photons is higher and the probability of photons being incident on one SPAD 3 simultaneously, i.e. within the dead time, is greater. This plurality of photons generates just one single electrical avalanche discharge in the SPAD 3. The first detection region 8 is therefore already saturated at least in part. In the outer, second detection region 9, the photon density is lower, and all or almost all of the photons are still individually detected. The second detection region 9 is therefore still in the linear or almost linear region of the characteristic curve 7. The two detection regions 8, 9 generate signal sequences 6b, 6c, the signal sequence 6b of the first detection region 8 having greatly overlapping pulses only being shown to be overlapping in this way for the purposes of explanation. The overlapping pulses are not generated in reality, since in this case photons that are incident on a single SPAD 3 simultaneously would need to be taken as a basis. If two photons are incident on different SPADs 3, it is possible for pulses to overlap.

Figure 7:
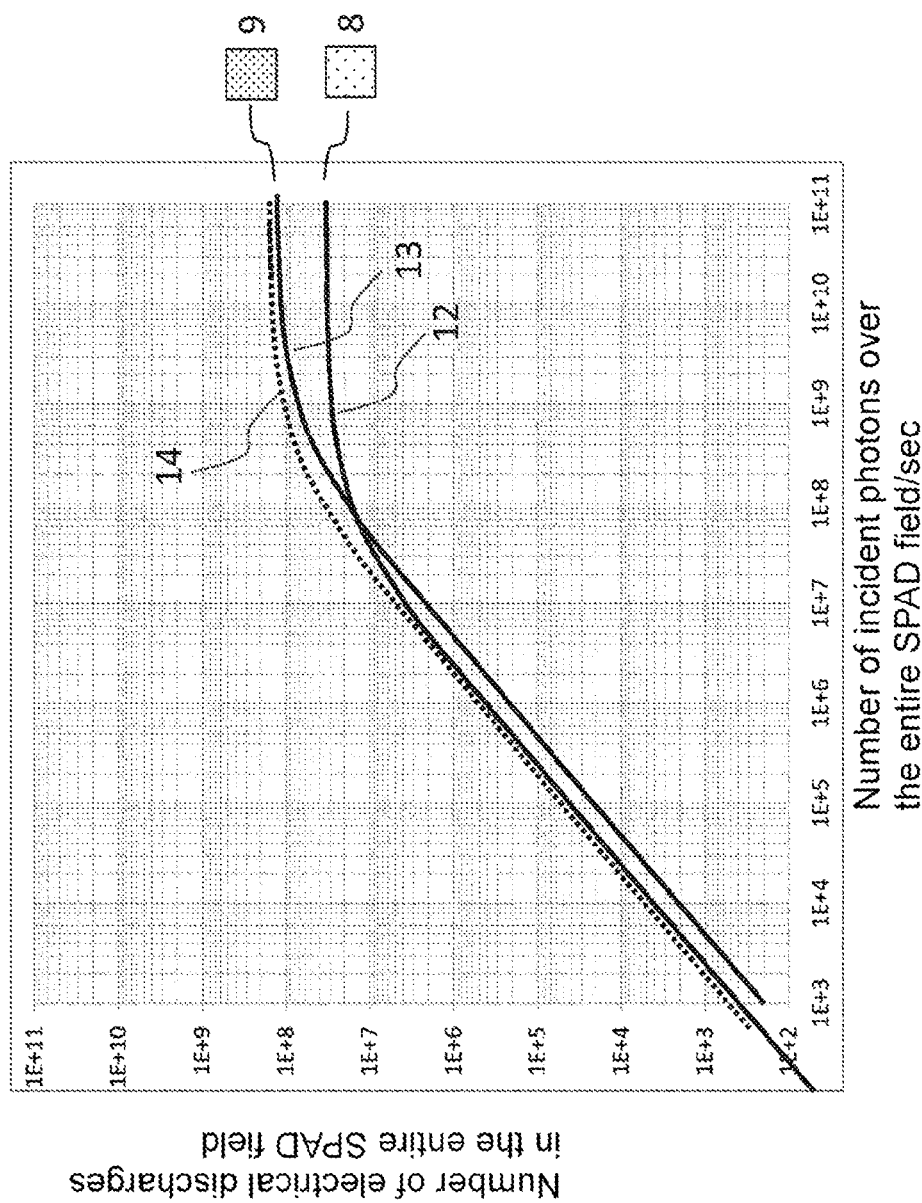
FIG. 7 shows the characteristic curves of the device according to the invention from FIG. 5.

Characteristic curves according to FIG. 3 apply at this point to the first detection region 8 and the second detection region 9. A first characteristic curve 12 of the first detection region 8 and a second characteristic curve 13 of the second detection region 9 are shown against the total amount of light that is incident in total on the device in FIG. 7. The characteristic curves 12, 13 are offset from one another due to the different distribution of the amount of light and the different field sizes. Furthermore, FIG. 7 shows the overall characteristic curve 14 as a sum of the characteristic curves 12, 13.

A key part of the invention is to suitably evaluate and comparatively correlate the output signals from the first detection region 8 and the second detection region 9, in order to correct the non-linear form of the overall characteristic curve 14 on the basis thereof. Closer inspection of FIG. 7 shows that, for count rates of less than $7 \times 10^7$ photons per second, the second characteristic curve 13 of the second detection region 9 is below the first characteristic curve 12 of the first detection region 8, since, overall, less light impinges on the second detection region 9 despite it having a larger field area. For count rates of greater than $7 \times 10^7$, the second characteristic curve 13 of the second detection region 9 is above the first characteristic curve 12 of the first detection region 8, since the relatively higher amounts of light already bring the first detection region 8 to saturation, and this is clear from the horizontally flat first characteristic curve 12. However, the second detection region 9 is not yet saturated, or is less highly saturated. The second characteristic curve 13 of the second detection region 9 is not yet completely flat and the output signal in the second detection region 9 rises further as the amount of light increases.

Figure 8:
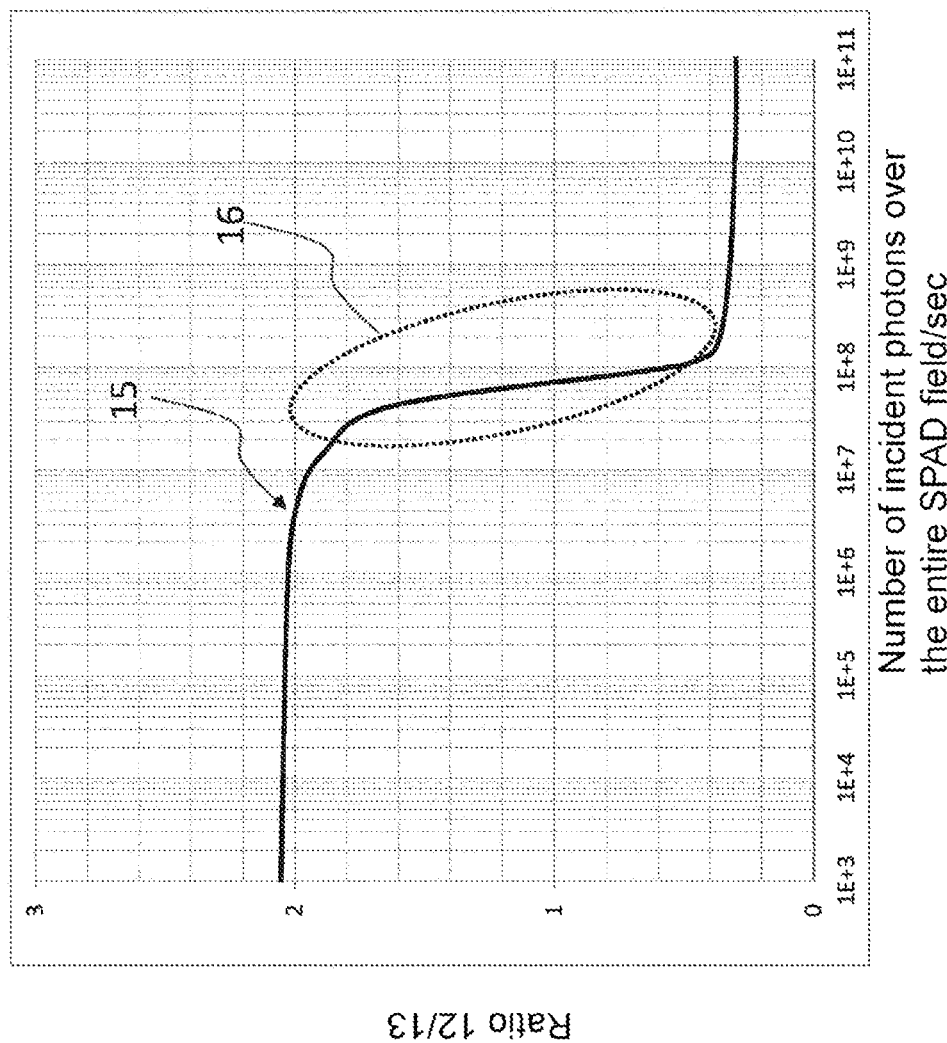
FIG. 8 shows an example of a correction curve generated by a method according to the invention for a device according to the invention from FIG. 5.

FIG. 8 shows an example of a correction curve 15 generated by a method according to the invention for a device according to the invention from FIG. 5. In this figure, the ratio between the first characteristic curve 12 and the second characteristic curve 13 is plotted against the total amount of light that is incident on all the detection regions 8, 9. The degree of saturation of the device can be concluded on the basis of the correction curve 15 resulting therefrom. For low count rates, the ratio is greater than 1. For high count rates, the ratio drops below 1. In the completely saturated region of the first detection region 8 and of the second detection region 9, i.e. the threshold value for infinitely high amounts of light, the ratio of the count rates is specified by the number of SPADs 3 in the two detection regions 8, 9. In the relevant region 16 in which saturation of the device is clearly apparent, the correction curve 15 drops steeply from the threshold value for small amounts of light (>1) to the threshold value for large amounts of light (<1). Precisely in the relevant region 16 of occurring saturation, the correction curve 15 thus constitutes a particularly sensitive measured variable for drawing conclusions on the actual overall amount of light that is incident on the entire detection region. The overall incident amount of light can be directly read out, specifically from the value of this measured variable. In the region of lower count rates, this measured variable is not particularly sensitive, because it rarely changes; however, this is unimportant, since this is the unsaturated region in which the direct signals from all the detection regions 8, 9 can be used without being corrected.

Figure 9:
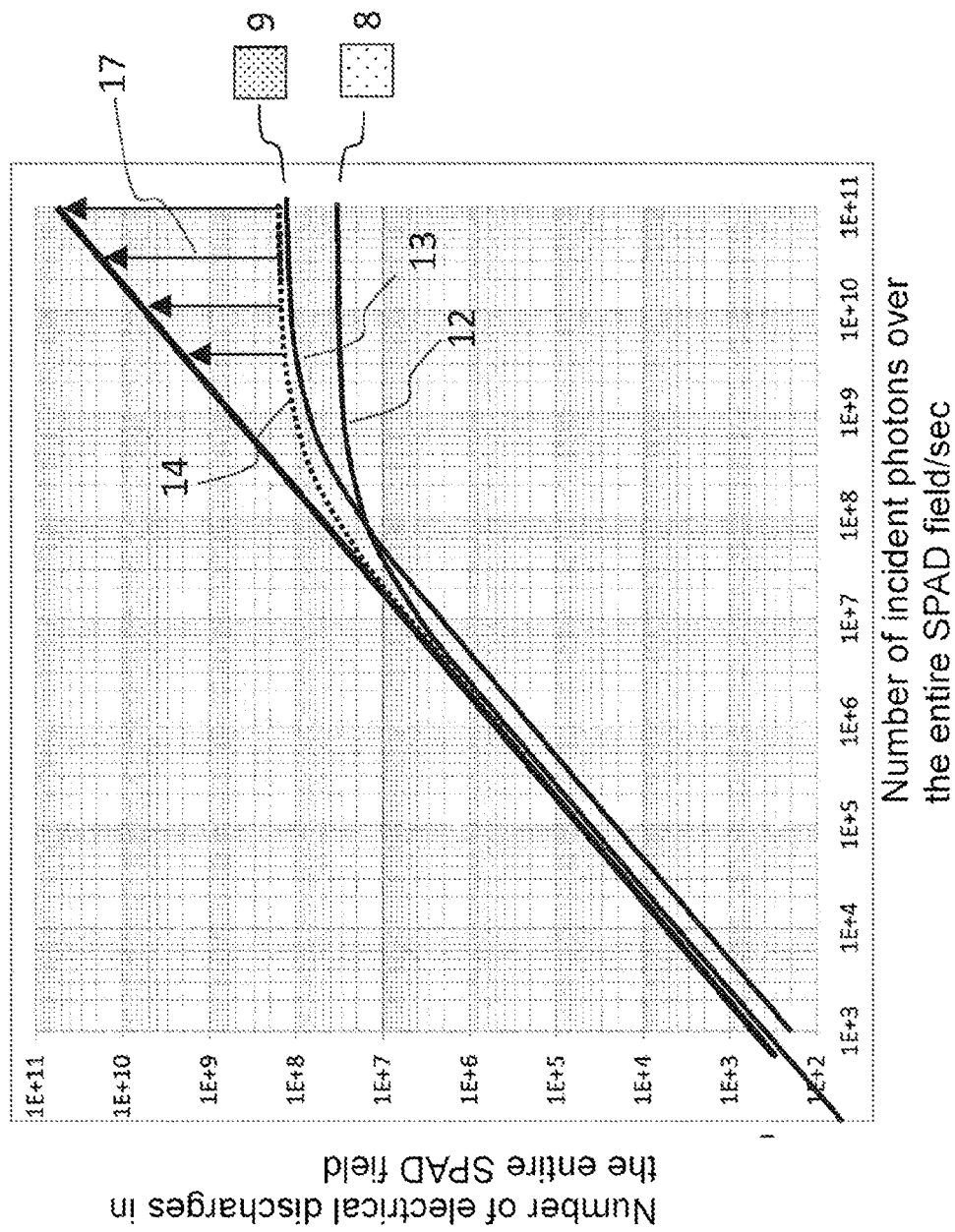
FIG. 9 shows the characteristic curve from FIG. 7, linearized using the method according to the invention.

By means of the relevant region of the correction curve 16, the output signal can be linearized at the start of the saturation region of the first detection region 8 by a correction factor 17 being determined, as shown in FIG. 9. The non-linearity of the overall characteristic curve 14 can be corrected on the basis of the correction factor 17 in order to achieve linear behavior of the device.

This correction is preferably carried out by means of digital signal processing of the actual device downstream. Here, the processing module can be integrated in the device and can be implemented by a digital signal processor or a field programmable gate array, for example. The characteristic curves 8, 9 and the correction curve 15 resulting therefrom can be determined by a calibration measurement. Since the characteristic curves 8, 9 are established for a given design of the device and a given lens design of a microscope, said curves can be determined once for a given apparatus type. The correction can then also be carried out downstream in a computer, for example, and can even be switched on or off.

One consequence of the correction is a change in the SNR. The signal is corrected by a correction factor 17 and the noise of this signal is therefore amplified. This changes the SNR of the output signal of the device. However, this is not problematic for imaging in a light microscope, since the manipulation is only carried out with comparatively large output signals in which the SNR is already high and the noise effect on the image quality is extremely low.

With regard to other advantageous embodiments of the device according to the invention, reference is made to the general part of the description and to the accompanying claims in order to avoid repetition.

Lastly, it should be expressly noted that the above-described embodiments of the method according to the invention and the device according to the invention are merely used to explain the claimed teaching, but do not have a limiting effect on the embodiments While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A method for improving dynamic range of a device for detecting light, the method comprising:
   providing at least two detection regions, wherein the detection regions are each formed by an array of a plurality of single-photon avalanche diodes (SPADs) and wherein the detection regions each comprise at least one signal output;
   determining a characteristic curve for each of the detection regions; and
   combining the characteristic curves with one another and/or offsetting the characteristic curves against one another in order to obtain a correction curve and/or a correction factor.

2. The method according to claim 1, further comprising linearizing an overall characteristic curve formed by output signals from the signal outputs based on the correction curve and/or the correction factor.

3. The method according to claim 1, wherein the correction curve and/or the correction factor is determined by dividing the characteristic curves.

4. The method according to claim 1, wherein output signals are corrected, after actual detection of the light, by digital signal processing.

5. The method according to claim 1, wherein the characteristic curves of the detection regions are determined once by a calibration measurement.

6. The method according to claim 1, wherein the light to be detected impinges on the detection regions at different intensities and/or with different spectral ranges.

7. The method according to claim 1, further comprising activating correction of output signals.

8. A device for detecting light, the device comprising:
   at least two detection regions, wherein the detection regions are each formed by an array of a plurality of single-photon avalanche diodes (SPADs) and wherein the detection regions each comprise at least one signal output,
   wherein the device is configured to:
   determine a characteristic curve for each of the detection regions, and
   combine the characteristic curves with one another and/or offset the characteristic curves against one another in order to obtain a correction curve and/or a correction factor.

9. The device according to claim 8, wherein the detection regions include a first, inner detection region and a second, outer detection region, the second detection region surrounding the first detection region.

10. The device according to claim 8, wherein the at least two detection regions are each designed as a sub-array of a silicon photomultiplier (SiPM).

11. The device according to claim 8, wherein the at least two detection regions are each designed as an array of a silicon photomultiplier (SiPM).

12. The device according to claim 11, further comprising a beam splitter arranged so as to split the light to be detected onto the at least two SiPMs.

13. The device according to claim 8, further comprising a dispersive element, in a form of a prism or a grating, arranged such that the detection regions are impinged upon by different spectral components of the light to be detected.

14. The device according to claim 8, wherein the detection regions are arranged symmetrically or asymmetrically to one another.

15. The device according to claim 8, wherein the detection regions form a substantially round detection surface.

16. The device according to claim 8, further comprising a processing module configured to perform digital signal processing of output signals from the signal outputs using the correction curve and/or the correction factor.

17. The device according to claim 16, wherein the processing module is a digital signal processor (DSP) or as a field programmable gate array (FPGA).

18. The device according to claim 8, wherein output signals from the signal outputs of the detection regions are coupleable together or combinable, either electronically or in a downstream computer, to form a single overall signal.

19. A microscope, comprising the device for detecting light according to claim 8.

20. The microscope according to claim 19, wherein the microscope is useable in fluorescence microscopy, SHG microscopy and/or Raman microscopy.

\* \* \* \* \*